(12) United States Patent
Kuratani (10) Patent No.: US 11,294,017 B2
(45) Date of Patent: Apr. 5, 2022

(54) MAGNETIC RESONANCE IMAGING APPARATUS

(71) Applicant: Hitachi, Ltd., Tokyo (JP)

(72) Inventor: Atsushi Kuratani, Tokyo (JP)

(73) Assignee: FUJIFILM HEALTHCARE CORPORATION, Chiba (JP)

( * ) Notice: Subject to any disclaimer, the term of this patent is extended or adjusted under 35 U.S.C. 154(b) by 0 days.

(21) Appl. No.: 17/183,639

(22) Filed: Feb. 24, 2021

(65) Prior Publication Data

US 2021/0364588 A1 Nov. 25, 2021

(30) Foreign Application Priority Data

May 21, 2020 (JP) .............................. JP2020-089148

(51) Int. Cl.
*G01R 33/567* (2006.01)
*G01R 33/561* (2006.01)
*G01R 33/36* (2006.01)
*G01R 33/563* (2006.01)

(52) U.S. Cl.
CPC ..... *G01R 33/5676* (2013.01); *G01R 33/3621* (2013.01); *G01R 33/5616* (2013.01); *G01R 33/56341* (2013.01)

(58) Field of Classification Search
CPC .......... G01R 33/3621; G01R 33/56341; G01R 33/5616; G01R 33/5676
See application file for complete search history.

(56) References Cited

U.S. PATENT DOCUMENTS

| 6,825,667 | B1 | 11/2004 | Tsuda | |
| 2013/0342204 | A1* | 12/2013 | Zhang | G01R 33/5676 324/309 |
| 2014/0266195 | A1* | 9/2014 | Levin | G01R 33/56509 324/309 |
| 2015/0154741 | A1* | 6/2015 | Chen | G01R 33/56509 348/77 |

FOREIGN PATENT DOCUMENTS

| JP | 2000-342554 A | 12/2000 |
| JP | 2006-014753 A | 1/2006 |

* cited by examiner

*Primary Examiner* — Gregory H Curran
(74) *Attorney, Agent, or Firm* — Mattingly & Malur, PC (57) ABSTRACT

A navigator echo is acquired during imaging, and when frequency is corrected based on phase change, the correction is performed with high accuracy without being affected by an offset caused by variations with time. An MRI apparatus including a navigation controller is configured to control an imaging unit acquiring an NMR signal, generate the navigator echo and collect navigation data during a predetermined measurement time, prior to collection of nuclear magnetic resonance signals for reconstructing an image of a subject. The phase change of the navigator echo is analyzed during the measurement time to calculate a correction value for correcting misalignment due to the phase change with a navigation analyzer that calculates a phase change amount relative to a reference, based on a difference between the phase change of the navigator echo and the phase change of the navigator echo serving as the reference during the measurement time.

15 Claims, 12 Drawing Sheets

FIG. 6A PHASE CHANE OF REFERENCE Echo

FIG. 6B PHASE CHANE OF ACQUIRED Echo

FIG. 6C DIFFERENCE OF PHASE CHANE

FIG. 6D CONVENTIONAL METHOD

MAGNETIC RESONANCE IMAGING APPARATUS

INCORPORATION BY REFERENCE

The present application claims priority from Japanese patent application JP-2020-089148 filed on May 21, 2020, the content of which is hereby incorporated by reference into this application.

BACKGROUND OF THE INVENTION

The present invention relates to a magnetic resonance imaging (hereinafter, referred to as "MRI") apparatus for measuring a nuclear magnetic resonance (hereinafter, referred to as "NMR") signal from hydrogen, phosphorus, or the like, within a subject, to acquire an image such as an image of a nuclear density distribution and an image of a relaxation time distribution. More particularly, the present invention relates to a technique for correcting misalignment with high accuracy, in diffusion-weighted imaging (DWI) using the MRI apparatus.

Description of the Related Art

In MRI apparatuses, one of causes of misalignment in an image is considered to be variation of a center frequency of nuclear magnetic resonance. The center frequency is determined by static magnetic field strength, and usually, the static magnetic field is controlled to be kept constant by a correction coil (shim coil). However, when heat is generated due to current flowing through a gradient magnetic field coil in generating a local gradient magnetic field using the gradient magnetic field coil, a coil for correcting the static magnetic field is physically affected, and the center frequency may fluctuate. In the case where a static magnetic field generating magnet is, for example, a permanent magnet, heat is transferred directly to the magnet, causing a change in the static magnetic field and the center frequency may fluctuate.

In diffusion-weighted imaging, such as DTI (Diffusion Tensor Imaging), DKI (Diffusion Kurtosis Imaging), and IVIM (Intravoxel Incoherent Motion), which is a kind of imaging method using the MRI apparatus, echo-planar imaging using MPG pulses is performed, and a large current flows through the gradient magnetic field coil. In imaging using such large current, more heat is generated in the gradient magnetic field coil than normal imaging, causing variation of the center frequency due to the static magnetic field variation, and misalignment may occur during the imaging. As a technique for correcting such misalignment due to the variation of the center frequency, there is a technique for predicting frequency variation to adjust the current in the shim coil (e.g., JP-A-2000-342554, hereinafter referred to as Patent Document 1).

In the technique as described in Patent Document 1 where the frequency variation is predicated for adjustment, it is difficult to cope with an abrupt change during imaging. In order to cope with the change during the imaging, it is desired to perform correction at any time during the imaging, but there is a problem that the imaging time is elongated if frequency measurement is performed in the middle of imaging. In contrast, there has also been suggested a method where a navigator echo is acquired during imaging, and a frequency variation value is obtained from the phase of thus acquired navigator echo (JP 2006-014753, hereinafter referred to as Patent Document 2). Specifically, a phase difference is calculated between the navigator echo serving as a reference and the navigator echo acquired thereafter. Then, the frequency variation value is calculated using the phase difference.

When the method of obtaining the frequency variation value using the navigator echo is applied to the diffusion-weighted imaging as described above, usually, MPG (motion probing gradient) pulses are applied in various directions, resulting in drastic change of the phase of spin, and accordingly the phase becomes largely different from the navigator echo as the reference, making it difficult to calculate the frequency variation value from the phase difference. Therefore, in the diffusion-weighted imaging, it is necessary to acquire the navigator echo before acquiring the MPG pulses.

Further, in acquiring the navigator echo, eddy current and others in the gradient magnetic field may vary with time, and this may cause an offset in the phase of the navigator echo. If the echo time (TE) of the navigator echo is made long, this offset may be so small that it is negligible as an error. However, as previously described, there is also the constraint that the navigator echo should be applied prior to the MPG pulse, and lengthening TE (Time to Echo) of the navigator echo under this constraint causes the TE of the DWI to be longer than usual. Since the DWI is basically a T2-weighted image, there is a problem that a tissue having long T2 tends to become high-signal (T2 shine through). In order to reduce this effect, there is also a constraint that the TE should be shortened as much as possible. Because of these constraints, the TE of the navigator echo must be reduced, resulting in that the error due to the offset increases.

In the imaging where the number of applied axes of MPG is small, the imaging can be completed before this error affects the misalignment correction. However, in the imaging where several tens of axes of MPG are applied, such as DTI, DKI, and IVIM, the imaging time is elongated, and the errors are accumulated, affecting the misalignment correction. As a result, due to deviation more than a resolution specified in the imaging condition, an image demanded by the user cannot be obtained, and also artifacts and blurring may occur in the image for analysis. Furthermore, in low magnetic field machines, for example, a fat suppression pulse, referred to as CHESS method, is sometimes used, but in this case, frequencies other than fat may be suppressed due to the frequency variation. Therefore, the image for analysis and as well as diagnosis may be affected similarly.

An object of the present invention is to provide the MRI apparatus capable of frequency correction with high accuracy, without being affected by the offset caused by the variation with time, when employing a method of acquiring the navigator echo during imaging and correcting the frequency based on the phase change.

SUMMARY OF THE INVENTION

Conventionally, there has been obtained an amount of phase change from occurrence of a navigator echo until the time to echo. On the other hand, the present invention acquires the phase change of the navigator echo within the measurement time for collecting the navigator echo. By taking a difference from the phase change of a reference navigator echo obtained in the same manner, it is possible to determine the phase change amount relative to the reference, without affected by an offset.

Specifically, the MRI apparatus of the present invention comprises an imaging unit having a static magnetic field generator configured to generate a static magnetic field in a space where a subject is placed, a transmitter configured to apply an RF magnetic field to the subject, and a receiver configured to receive a nuclear magnetic resonance signal generated by nuclear magnetic resonance from the subject, an operation unit configured to perform an operation including image reconstruction using the nuclear magnetic resonance signal, a navigation controller configured to control the imaging unit to generate a navigator echo and collect navigation data during a predetermined measurement time, prior to collection of nuclear magnetic resonance signals for reconstructing an image of the subject, and a navigation analyzer configured to analyze phase change of the navigator echo during the measurement time to calculate a correction value for correcting misalignment due to the phase change. The navigation analyzer calculates the phase change amount relative to a reference, based on a difference between the phase change at each time of the measurement time of the navigator echo, and the phase change of the navigator echo serving as the reference at each time of the measurement time, so as to calculate the correction value. Here, the phase change indicates the change of phase at every moment in the measurement time, and the amount of phase change indicates the phase change amount relative to the reference.

According to the present invention, without being affected by the pulse such as the MPG pulse, and without extending the TE of DWI, it is possible to calculate the phase change amount with high accuracy, whereby it is possible to correct with high accuracy, the misalignment due to the center frequency variation during imaging. Consequently, accurate analytical results can be obtained with DKIs, IVIM, etc.

BRIEF DESCRIPTION OF THE DRAWINGS

FIGS. 6A to 6D illustrate calculations of a phase change amount of Embodiment 1.

FIGS. 10A to 10C illustrate calculations of the phase change amount in Embodiment 2.

DETAILED DESCRIPTION OF THE PREFERRED EMBODIMENT

There will now be described embodiments of an MRI apparatus of the present invention with reference to the accompanying drawings. It is to be noted in all the figures for describing the embodiments of the invention, those having the same functions are denoted by the same reference numerals, and they will not be described redundantly.

Figure 1:
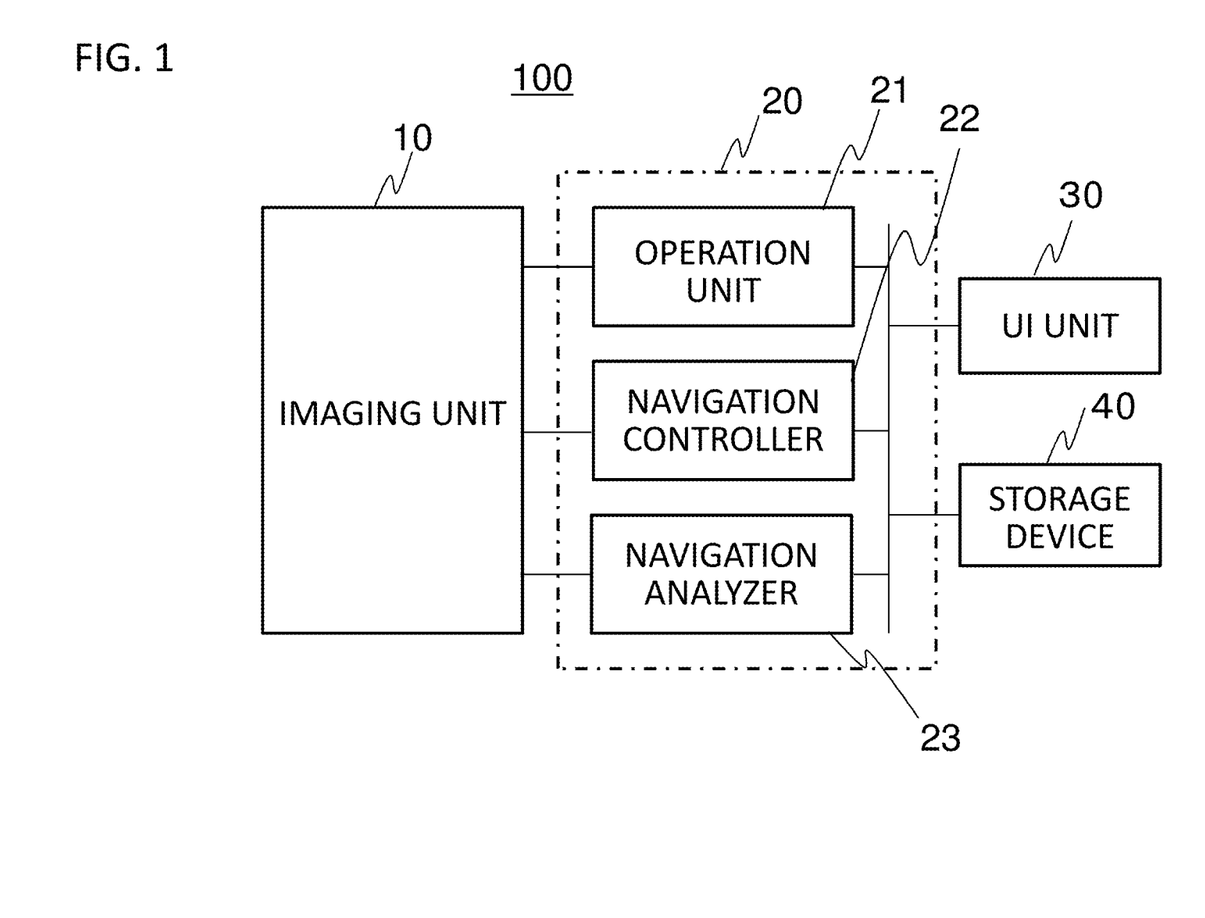
FIG. 1 is a block diagram showing an example of an overall configuration of an MRI apparatus according to the present invention.

First, an overview of an embodiment of the MRI apparatus of the present invention will be described. FIG. 1 is a block diagram showing an overall configuration of an MRI apparatus. As shown in FIG. 1, the MRI apparatus 100 of the present embodiment includes an imaging unit 10, an operation unit 21, a navigation controller 22, and a navigation analyzer 23. In the illustrated embodiment, the operation unit 21, the navigation controller 22, and the navigation analyzer 23 are intended to be incorporated in a generic processor 20 for implementing these functions. The processor 20 may be a computer including a CPU and a memory, or may be a system including hardware such as ASIC and FPGA in addition to the computer, and it is connected to the user interface (UI) unit 30 including a display device and an input device, and to an external storage device 40. The external storage device 40 may include a storage device connected directly or by wire, and a storage device connected wirelessly or via the Internet and others.

Figure 2:
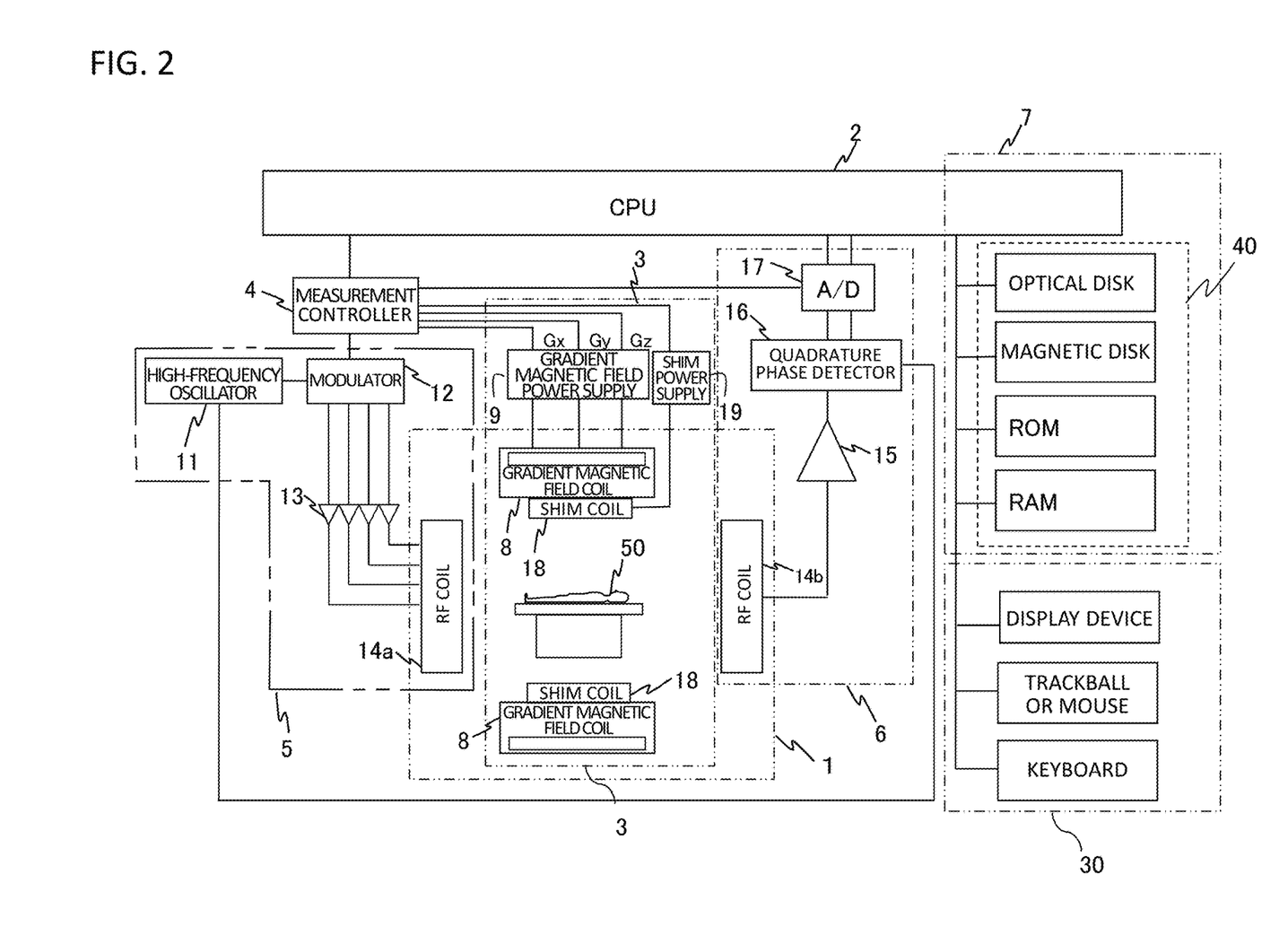
FIG. 2 is a block diagram showing the overall configuration of the MRI apparatus including details of an imaging unit.

The imaging unit 10 has the same configuration as a general MRI apparatus, and the imaging unit may comprise, for example, a static magnetic field generator for generating a static magnetic field in a space to place a subject, a transmitter for applying an RF magnetic field to the subject, and a receiver for receiving from the subject a nuclear magnetic resonance signal generated by nuclear magnetic resonance. FIG. 2 shows the overall configuration of the MRI apparatus including details of the imaging unit 10. The MRI apparatus shown in FIG. 2 comprises a static magnetic field generator 1, a gradient magnetic field generator 3, a measurement controller 4, a transmitter 5, a receiver 6, a signal processor 7, and a CPU (central processing unit) 2. The signal processor 7 and the CPU 2 have functions corresponding to the processor 20 of FIG. 1.

In the static magnetic field generator 1, there is arranged a static magnetic field source of a permanent magnet system, a normal conduction system, or superconducting system. A uniform static magnetic field is generated, in a direction perpendicular to a body axis in the space around the subject 50 for the case of a vertical magnetic field system, whereas for the case of a horizontal magnetic field system, it is generated in the body axis direction. Also in the vicinity of the static magnetic field generating source, there is disposed a shim coil 18 for correcting non-uniformity of the static magnetic field. The shim coil 18 is connected to a shim power supply 19, and it is driven by the current supplied from the shim power supply 19 to generate a corrected magnetic field. This corrected magnetic field enables correction of variation with time in the static magnetic field, together with correcting the non-uniformity of the static magnetic field.

The gradient magnetic field generator 3 comprises a gradient magnetic field coil 8 wound in the three axial directions of X, Y, and Z, being a coordinate system of the MRI apparatus (stationary coordinate system), and a gradient magnetic field power supply 9 for driving the respective gradient magnetic field coils. In response to a command from the measurement controller 4 described later, the gradient magnetic field power supply 9 is driven for each coil, and gradient magnetic fields Gx, Gy, and Gz are applied in the three axial directions X, Y, and Z, respectively. At the time of imaging, a slice direction gradient magnetic field pulse (Gs) is applied in a direction perpendicular to a slice plane (imaging section), thereby setting a slice plane for the subject 1. A phase encoding direction gradient magnetic field pulse (Gp) and a frequency encoding direction gradient magnetic field pulse (Gf) are applied in the remaining two directions perpendicular to the slice plane and perpendicular to each other, to encode position information in each direction in the echo signals. In some cases, the gradient magnetic field coil 8 may be utilized as the shim coil.

The measurement controller 4 is a control means for repeatedly applying RF magnetic field pulses (hereinafter, referred to as "RF pulses") and gradient magnetic field pulses according to a predetermined pulse sequence. The measurement controller 4 is operated under control from the CPU 2, and transmits various commands necessary for collecting data of a tomographic image of the subject 50, to the transmitter 5, to the gradient magnetic field generator 3, and to the receiver 6. Various pulse sequences are prepared depending on imaging methods, and at the time of imaging, when the imaging is method is determined, the CPU 2 reads an associated pulse sequence and provides the measurement controller 4 with the pulse sequence. In the present embodiment, there is executed the pulse sequence of diffusion imaging, to which generation and collection of navigator echo are added. Details of the pulse sequence will be described later.

The transmitter 5 is provided to apply RF pulses to the subject 50, so as to cause nuclear magnetic resonance in nuclear spins of atoms constituting biological tissues of the subject 50, and the transmitter comprises a high-frequency oscillator 11, a modulator 12, an RF amplifier 13, and an RF coil (transmission coil) 14a on the transmission side. An RF pulse outputted from the high-frequency oscillator 11 is amplitude-modulated by the modulator 12 at a timing according to a command from the measurement controller 4, and the amplitude-modulated RF pulse is amplified by the RF amplifier 13. Then, the RF pulse is supplied to the RF coil 14a disposed in proximity to the subject 50, whereby the subject 50 is irradiated with the RF pulse. By adjusting a high frequency emitted from the high-frequency oscillator 11, it is possible to adjust the nuclear magnetic resonance frequency (center frequency).

The receiver 6 detects an echo signal (NMR signal) emitted by nuclear magnetic resonance of the nuclear spins constituting the biological tissues of the subject 50, and the receiver comprises an RF coil (receiving coil) 14b on the receiving side, a signal amplifier 15, a quadrature phase detector 16, and an A/D converter 17. The RF coil 14b disposed in proximity to the subject 50 detects the NMR signal as a response of the subject 50, being induced by an electromagnetic wave applied from the RF coil 14a on the transmission side. Then, the NMR signal is amplified by the signal amplifier 15, and thereafter, it is divided into signals of two systems being orthogonal to each other, by the quadrature phase detector 16 at a timing according to a command from the measurement controller 4, and they are converted respectively into digital amounts by the A/D converter 17 to be sent to the signal processor 7 as measurement data.

The signal processor 7 performs various data processing, display and storage of a processing result, and a part of those functions are implemented by the CPU 2. The signal processor 7 is connected to an external storage device 40 such as an optical disk and a magnetic disk, and to a UI unit 30 provided with a display device 31 and an input device 32. When the signal processor 7 inputs the measurement data from the receiver 6, the CPU 2 performs processing such as signal processing and image reconstruction, and displays a tomographic image of the subject 50 as a result on the display device 31, along with recording the result on the magnetic disk and others, in the external storage device 40. The input device 32 inputs various control information of the MRI apparatus and control information of the processing performed by and the signal processor 7, the input device comprising a trackball or a mouse, a keyboard, and others. The input device 32 is disposed in proximity to the display device 31, and an operator controls the various processing of the MRI apparatus interactively by operating the input device 32 while viewing the display device 31.

Main functions of the CPU 2 include an arithmetic operations (a function of the operation unit 21) using NMR signals received by the receiver 6, and the control of the imaging unit 10 via the measurement controller 4. The arithmetic operations include an operation such as image reconstruction using the NMR signals and generating a calculated image from the reconstructed image, and in addition, also includes other operations such as an analysis of the phase using the NMR signal (navigator echo) (a function of the navigation analyzer 23). The control of the imaging unit 10 further includes a control related to generation and collection of the navigator echo (a function of the navigation controller 22).

The outline of actions of the MRI apparatus having the configuration as described above will be described with reference to FIG. 3.

Figure 3:
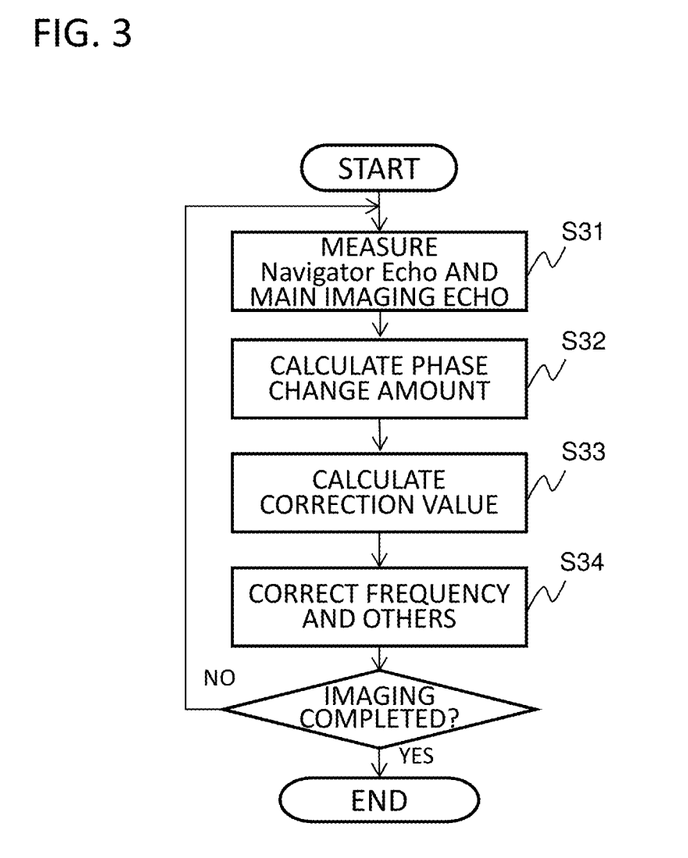
FIG. 3 is a flowchart showing a processing of the MRI apparatus shown in FIG. 1.

After imaging parameters are provided, the imaging unit 10 starts imaging on the conditions being provided under the control of the measurement controller 4 (S31). The imaging parameters may be preset by default, together with the pulse sequence, or may be specified by the user via the UI unit 30. In addition to general imaging parameters such as TE and TR, there are provided intensity of MPG and an application axis in DWI.

Figure 4:
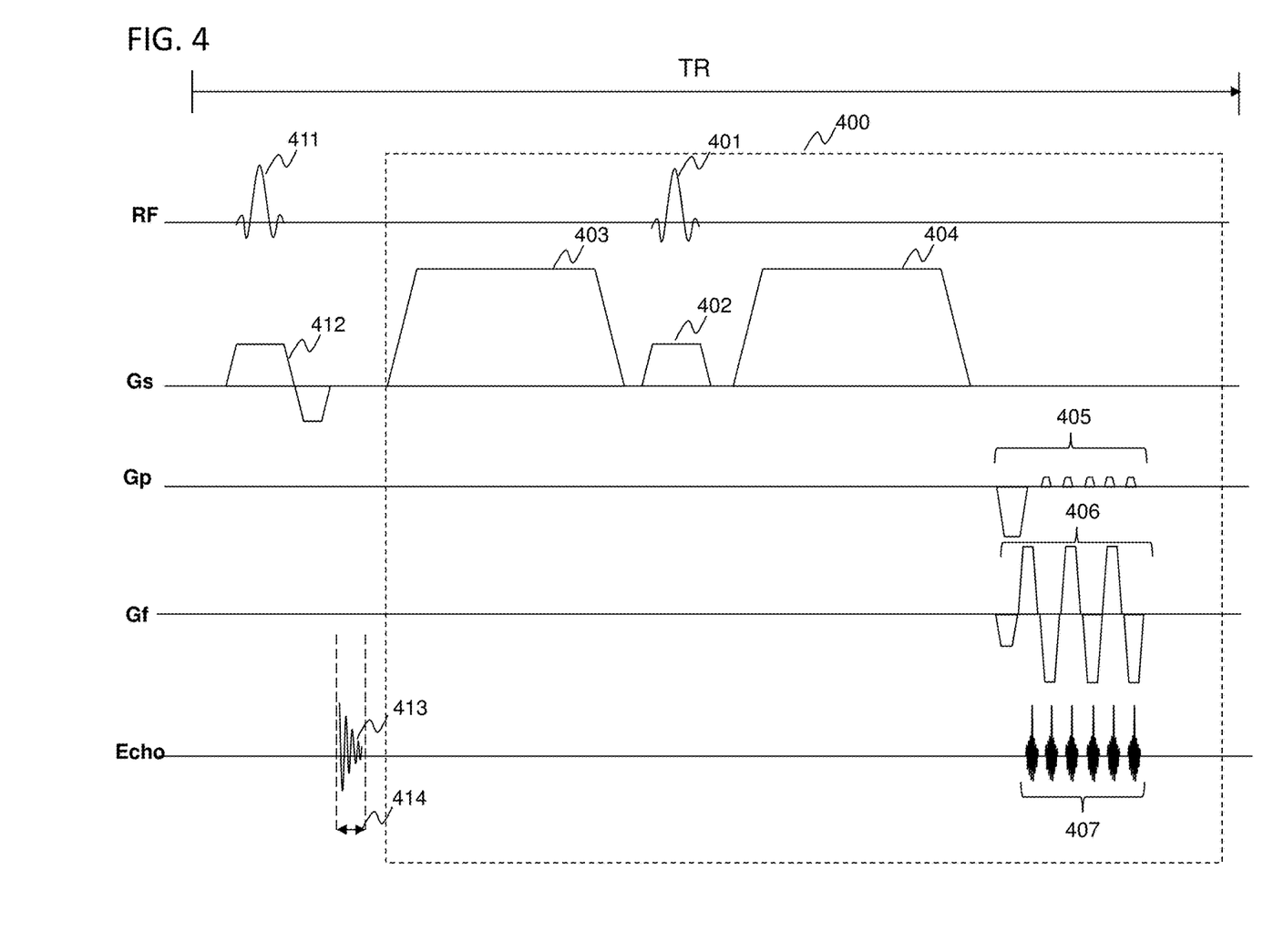
FIG. 4 illustrates an example of a pulse sequence employed in Embodiment 1.

As shown in FIG. 4, the pulse sequence 400 of DWI is EPI (Echo Planar Imaging) pulse sequence where the MPG pulses 403 and 404 having large intensity are applied before and after the excitation pulse 402, and then, the reversal of the readout gradient pulse Gf 405, and the application of the blip-shaped phase-encoded gradient magnetic field Gp 406 are repeated, followed by measuring a plurality of echo signals 407 after one excitation. In the present embodiment, the navigation controller 22 generates and collects the navigator echo 411 before the first MPG pulse 403. It is to be noted FIG. 4 shows a case of measuring an FID signal as the navigator echo, and there are several aspects of the navigator echo. These aspects will be described in the embodiments described later.

As for the navigator echo, for example, generation and collection of the navigator echo at every repetition time TR of the pulse sequence allows acquisition of multiple navigator echoes. Among those navigator echoes, the navigator echo acquired prior to imaging is used as a reference navigator echo.

The receiver 6 passes the measured data of the navigator echoes collected during a predetermined sampling time, to the navigation analyzer 23 of the CPU 2, where phase change in the sampling time is calculated. The navigation analyzer 23, which includes a fitting unit, performs fitting of the phase at each clock time of the sampling time, for example, thereby calculating the phase change during that time. The navigation analyzer 23 further calculates the phase change similarly for the reference navigator echo, and obtains a difference therebetween, so as to obtain a phase change amount relative to the reference (S32).

Subsequently, the navigation analyzer 23 uses the phase change amount to calculate a correction value for correcting a misalignment due to the phase change (S33). Correction of the misalignment due to the phase change includes correction of a current value of the shim coil 18 (correction of the static magnetic field), correction of the center frequency (adjustment of the high-frequency oscillator 11), and correction of the image (correction by the operation unit 21), and the navigation analyzer 23 calculates a correction value in association with an object to be corrected. Finally, correction of each part is performed using the correction value (S34). If the correction can be made in real time depending on the object, the correction is immediately reflected in the DWI measurement after the navigator echoes are collected. If the correction cannot be reflected immediately, the correction on which the correction value has been reflected is performed after a lapse of one or more TRs. In the case of correction of the image, the correction is performed on the image of the echo signals acquired by the EPI performed after the navigator echoes, using the correction value calculated from the navigator echoes collected during the repetition time.

According to the MRI apparatus of the present embodiment, the phase change amount is calculated by the fitting of the phase change at each clock time within the measurement time, rather than using the phase difference of the navigator echoes in the TE. Therefore, it is possible to accurately calculate the correction value without being affected by an offset. In addition, it is not necessary to elongate the TE for measuring the navigator echo in order to determine the phase change amount with high accuracy. Therefore, it is possible to prevent the extension of the measurement time for DWI that requires application of MPG in many axes and repetitive measurement, along with effectively preventing the misalignment due to the center frequency variation during the measurement.

There will now be described specific embodiments of the navigator echo generation and collection.

Embodiment 1

As shown in FIG. 4, the present embodiment is characterized in that a signal to which a readout gradient is not applied, is measured as a navigator echo.

Figure 5:
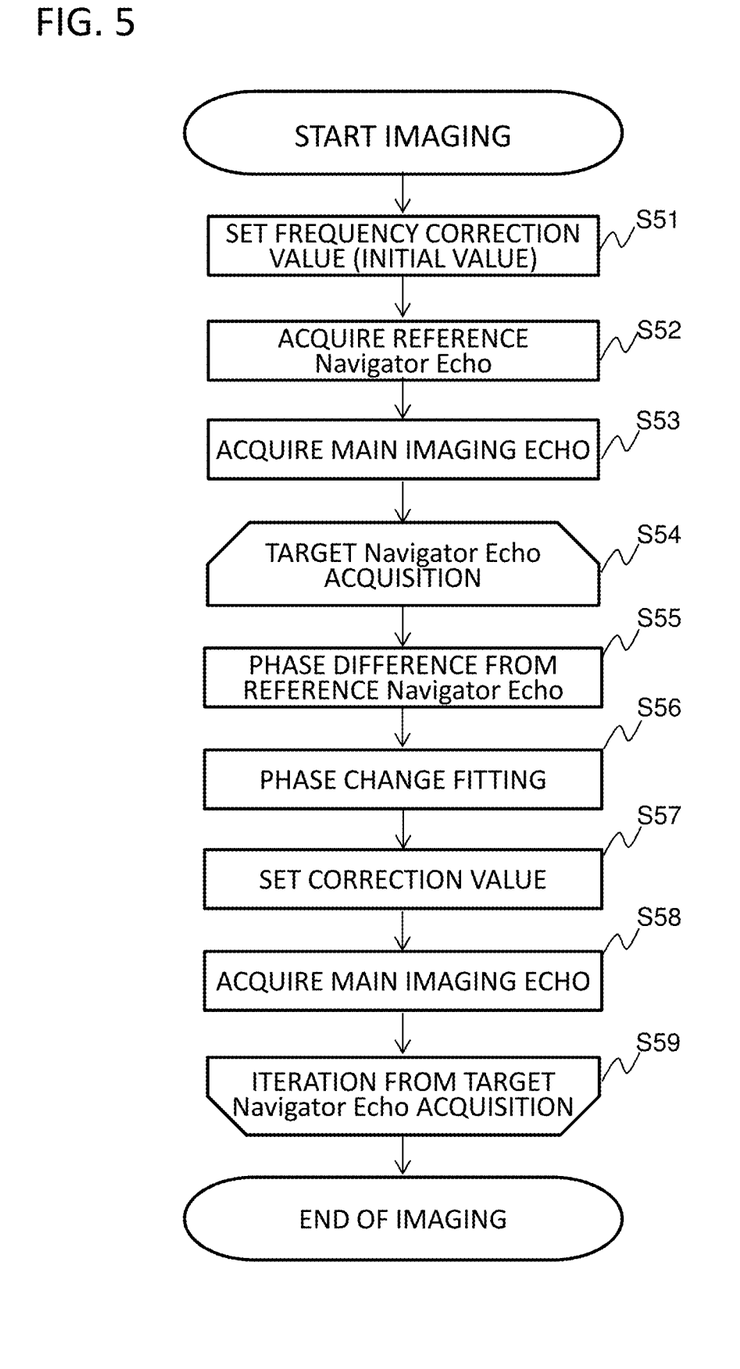
FIG. 5 is a flowchart showing a processing of Embodiment 1.

With reference to FIG. 5, a processing of the present embodiment will be described. When imaging is started, the navigation analyzer 23 sets an initial value of frequency correction (S51). The initial value is a value for calculating a subsequent correction value, and it may be a value predicting the frequency change obtained by prior imaging, or no value may be provided as the initial value.

First, a navigator echo serving as a reference (reference navigator echo) is obtained (S52). That is, after applying an excitation pulse 411 along with a region-selective gradient magnetic field Gs, the navigator echo 413 is collected during a predetermined sampling time 414, without applying a readout gradient. The sampling time 414 is set to be long enough for sufficiently calculating the phase change during this time. Then, an echo signal(s) (main imaging echo) of the main imaging sequence is acquired (S53). The main imaging indicates the sequence for the image that the user intends to acquire, and according to the present embodiment, it corresponds to the DWI sequence 400 shown in FIG. 4. Subsequently, the navigation controller 22 repeats measurement of the navigator echo and measurement of the imaging echo (S54 to S59), and during this repetition, the navigation analyzer 23 calculates the correction value (S55 to S58). The measurement of the navigator echo and the measurement of the main imaging echo in this repetition are performed in the same manner as in steps S52 and S53 as described above. Steps S54 to S59 shall be the repetition time TR of imaging, for example.

In order to calculate the correction value, a phase change is calculated from a difference between the reference navigator echo acquired in step S52 and the navigator echo (target navigator echo) acquired in step S54 (S55). Then, the phase change obtained from the difference is subjected to fitting (S56). The fitting may be a linear function as in Equation 1, or it may be an equation like Equation 2 considering the influence of eddy currents:

$$dP = a1 \times t + b \qquad \text{[Equation 1]}$$

$$dP = a1*t + a2*\exp(-a3/t) \qquad \text{[Equation 2]}$$

where dP is phase change, a, a1, a2, and a3 are coefficients, and b is offset.

Figures 6A, 6B:
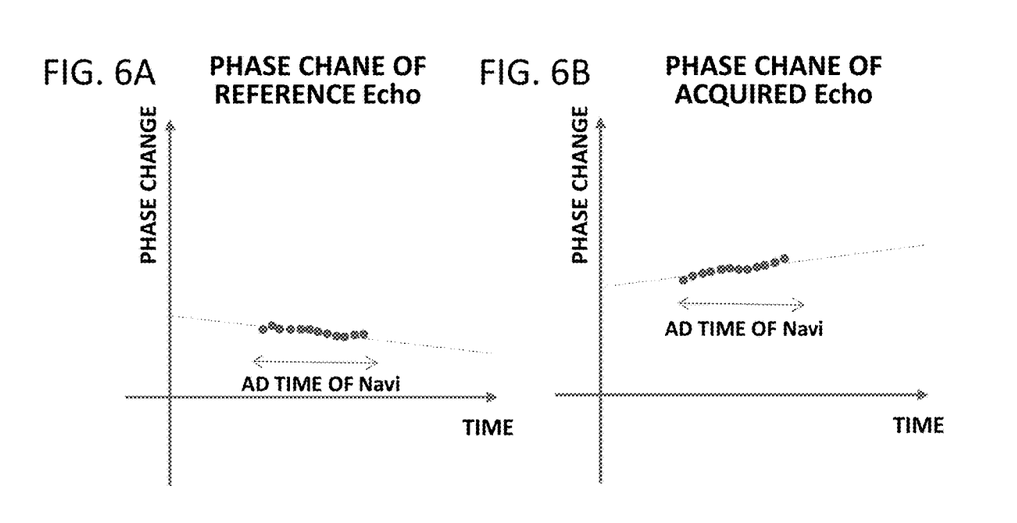
FIGS. 6A and 6B respectively illustrate the phase change of a reference navigator echo and the phase change of a target navigator echo.
Figure 6C:
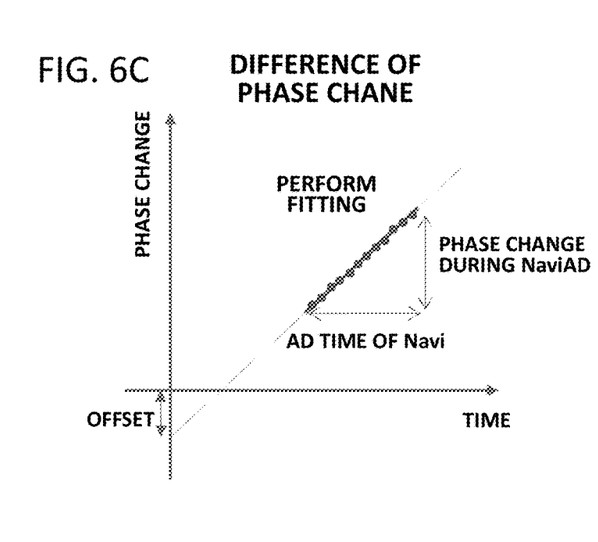
FIG. 6C illustrates a difference of phase change.
Figure 6D:
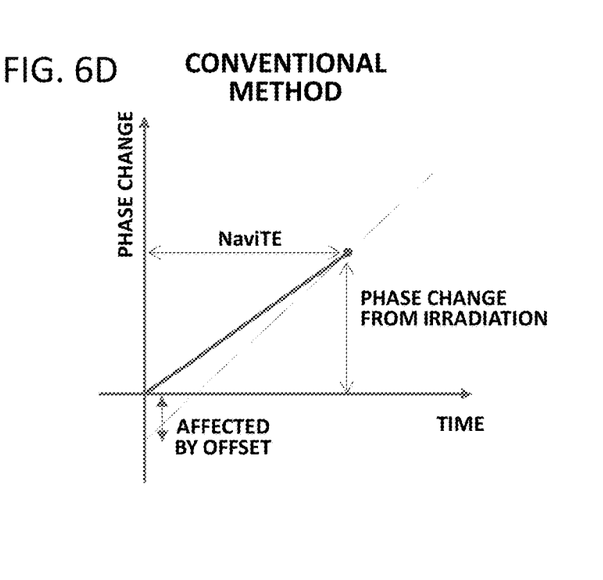
FIG. 6D illustrates the phase change calculated by a conventional method.

FIGS. 6A to 6C illustrate how the fitting is performed. FIGS. 6A and 6B illustrate the phase change of the reference navigator echo and of the target navigator echo, respectively, and FIG. 6C shows the difference therebetween, and illustrates the fitting is performed on the difference. As a reference, FIG. 6D shows a calculation example of the phase change according to a conventional method. As shown in FIG. 6D, in the conventional method, since the phase change amount is calculated using the phase change in a time duration from RF irradiation for generating the navigator echo to TE, an offset may occur in the duration and the offset becomes an error. On the other hand, in the technique of the present embodiment, fitting is performed on the difference of the phase change, the offset is eliminated and it is possible to calculate the phase change accurately without being affected by the offset.

Next, in step S57, the correction value is calculated using the phase change amount relative to the reference. The correction value may be a value of corrected current flowing through the shim coil 18, or may be a correction value of the center frequency at the time of irradiation of the excitation pulse 401. The correction value of the frequency can be calculated from a relational expression between the phase ($\omega t$) and the frequency (f) ($\omega = 2\pi f$). The relationship between the current value flowing through the shim coil 18 and the magnetic field strength generated by the current is determined by a characteristic of the shim coil. Therefore, the corrected current of the shim coil can be calculated from an amount of variation of the static magnetic field, obtained from the relational expression between the magnetic resonance frequency (f0) and the static magnetic field strength (B0) (f0=$\gamma$B0). Since there is a linear relationship between the static magnetic field (center frequency) and the real space position, misalignment in the real space, i.e., the misalignment on the image, can be corrected based on the static magnetic field variation amount.

The calculated correction value is reflected in the main imaging after the acquisition of the navigator echo in step S54 (S58). That is, by using the correction value thus calculated in S57, the corrected current may be made flow through the shim coil 18, or the center frequency at the time of the next irradiation may be corrected. Further, when it takes time before the start of the corrected current flowing through the shim coil, there is a possibility that the misalignment of main imaging echoes has already started. For this case, the correction may be performed on the main imaging echo obtained in step S58, at the time of image reconstruction with the use of the correction value calculated in step S57. When the imaging echo should be still acquired in step S59, the process returns to step S54. The operation from steps S54 to S59 is repeated one or more times, and then imaging is completed.

It is to be noted the time interval of step S53 and S59 is assumed as the TR, but it is not necessarily limited to the TR, if the interval of the main imaging is changed due to synchronization such as electrocardiogram, pulse wave, and breath. Further, in FIG. 5, the first main imaging echo is acquired after acquiring the reference navigator echo (S52). However, the main imaging echo acquisition (S53) may be performed before the reference navigator echo acquisition, or after calculating the correction value in step S57.

According to the present embodiment, the phase change amount is calculated by performing fitting of the phase difference relative to the reference navigator echo. Therefore, it is possible to calculate the phase change amount without being affected by the offset, allowing accurate misalignment correction.

Modification 1

In Embodiment 1, the measurement of the reference navigator echo is performed one time, prior to the main imaging, and the calculation of the phase change in the subsequent repetition is performed using the reference navigator echo. In the case where the number of repetitions of the main imaging is large and the imaging time is long, it is possible to acquire a plurality of reference navigator echoes during the repetition of the main imaging, and for the calculation of the phase change, the reference navigator echo obtained most recently may be used.

Figure 7:
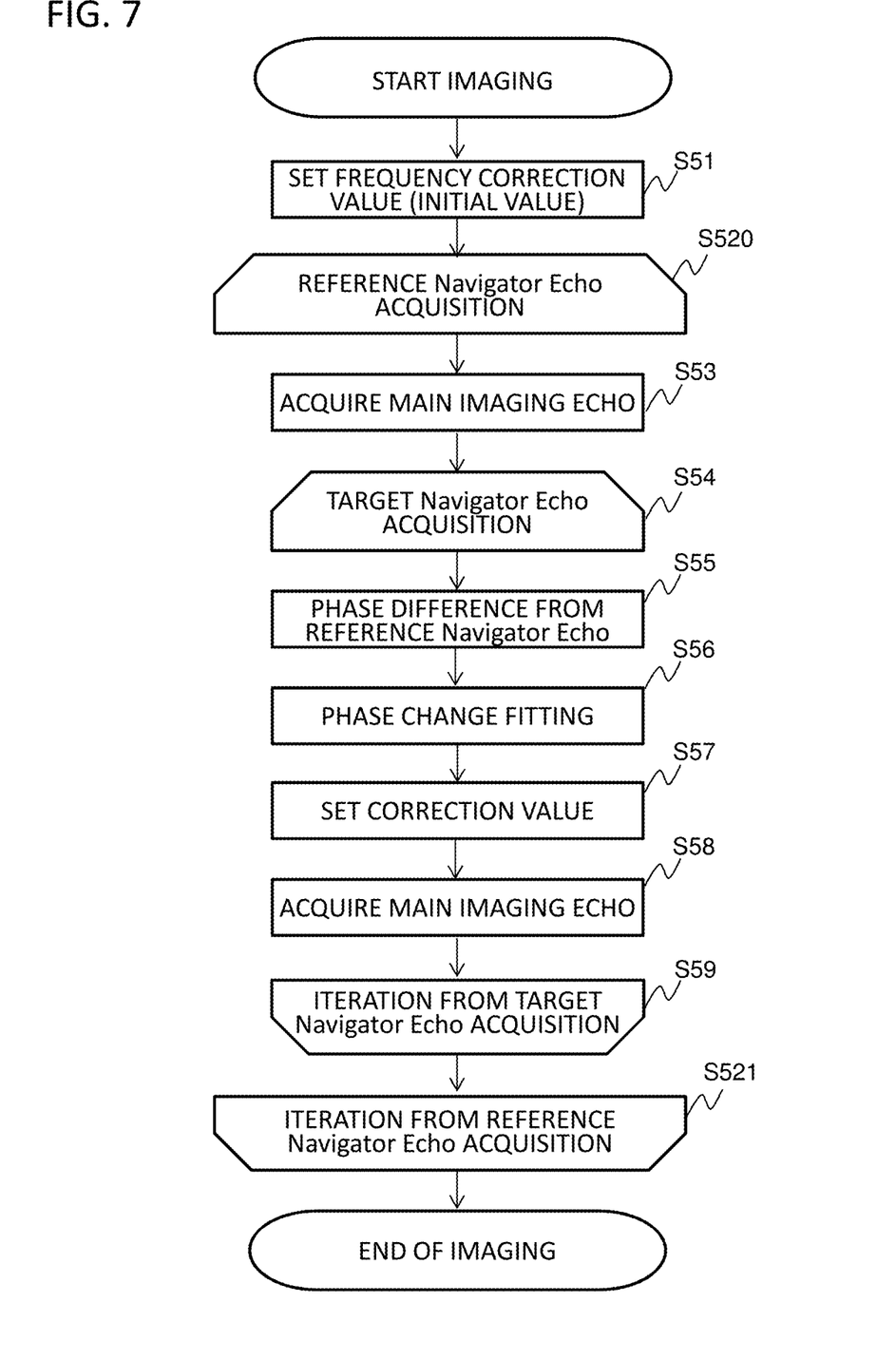
FIG. 7 is a flowchart showing the processing of Modification 1.

FIG. 7 shows the processing of this modification. In FIG. 7, the same steps as in FIG. 5 are denoted by the same reference numerals, and redundant description will be omitted. In the present modification, steps from S520 to S521 for acquiring the reference navigator echo are repeated. That is, after acquiring the reference navigator echo (S520), the main imaging echo is measured (S53), and the repetitive imaging including the measurement of the target navigator echo (S54) to the main imaging echo measurement (S58) is performed (S59) in the same manner as in Embodiment 1. When further imaging is performed after a plurality of repetitions (S521), the process returns to the step S520, repeating from S520 to S521. The process ends when the planned imaging is completed.

The timing of acquiring the reference navigator echo may be when the number of repetitions of steps S54 to S58 reaches a predetermined number of times, or may be when the pulse sequence shape in the TR drastically changes. A drastic change in the shape of the pulse sequence may occur, for example, when the number of slices within the TR changes, when the timing of the readout gradient field changes, or when physical axes of the phase encoding or of frequency encoding are changed. Further, it may be the timing when sudden phase changes due to body motion or the like occur. For example, when the phase change amount calculated in step S56 is greater than a predetermined value (e.g., the phase change amount calculated before or its average value), the reference navigator echo may be taken again.

According to the present modification, it is possible to avoid influence of such changes in the pulse sequence and unexpected phase variation, thereby performing correction stably. In FIGS. 5 and 7, there has been described the case where measurement of the target navigator echo is performed for each measurement of the main imaging echo. However, for example, one target navigator may be acquired for every multiple times of the DWI sequence shown in FIG. 4.

Modification 2

The processing in the present modification is the same as the processing shown in FIG. 5 or FIG. 7. The present modification includes a process of eliminating an inappropriate correction value, when the correction value calculated in step S57 is inappropriate.

Figure 8:
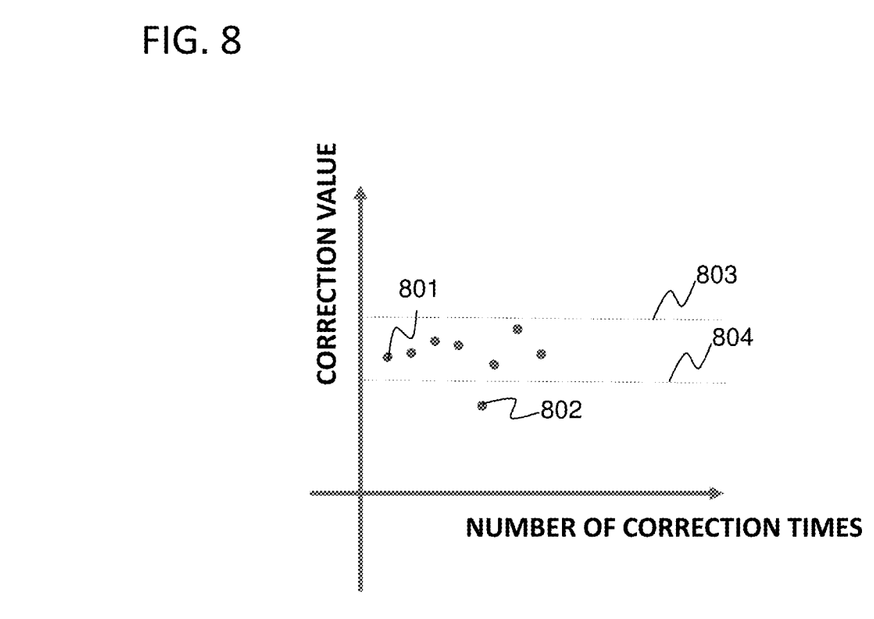
FIG. 8 illustrates a threshold value of a correction value provided in Modification 2.

Therefore, the navigation analyzer 23 is provided with a threshold with respect to the correction value or the phase variation amount. The threshold may be an upper limit or a lower limit of the statistical value of the predicted values obtained from the phase variation measured in advance, or it may be set each time, based on the average value of the correction values calculated multiple times in the imaging. The navigation analyzer 23 imposes a limit so that the variation amount is not corrected beyond the threshold being provided, in setting the correction value in step S57 of FIG. 5 and FIG. 7. For example, in the example shown in FIG. 8, there are provided the threshold 803 of the upper limit and the threshold 804 of the lower limit with respect to the correction value. Correction of the frequency and static magnetic field may be performed, using the correction value 801 within the range of the threshold. On the other hand, as for the correction value 802 outside the threshold, it is determined that the correction value is based on an inappropriate phase variation, and correction is not performed.

According to the present modification, a threshold is provided for the correction value or the phase variation amount, and this allows stable correction without excessive correction or reverse correction, even when a sudden phase change occurs due to factors such as noise.

Embodiment 2

In Embodiment 1, the navigator echo is acquired without applying a readout gradient. In the present embodiment, more than one readout gradients are applied to obtain a plurality of navigator echoes. The processing is the same as that of Embodiment 1 (FIG. 5) or the modification thereof (FIG. 7), and thus with reference to FIG. 5, different points will be described.

Figure 9:
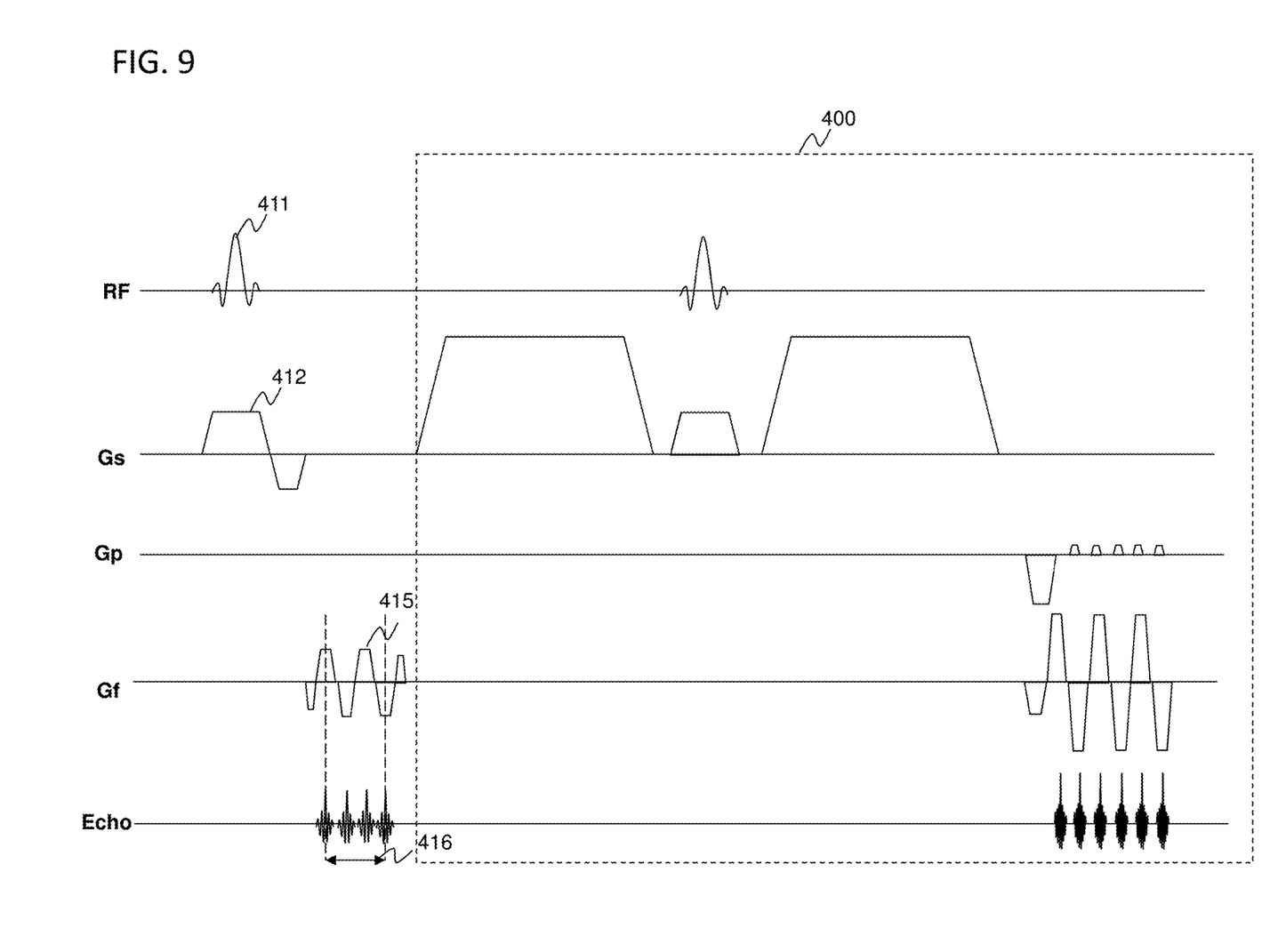
FIG. 9 illustrates an example of the pulse sequence employed in Embodiment 2.

As shown in FIG. 9, in the step of acquiring the navigator echoes of S52 and S54 in the present embodiment, a readout gradient 415 which is inverted after the application of the excitation pulse 411 is applied, and a plurality of (four in the figure) navigator echoes 416 are collected at different TEs. The imaging sequence 400 is similar to FIG. 4. Then, in step S55, each phase difference between the reference navigator echo and the target navigator echo in the corresponding TE among different TEs, is subjected to fitting. Similar to Embodiment 1, the fitting may use the linear function (Equation 1), or the fitting function considering eddy currents (Equation 2) may be used.

Figure 10A:
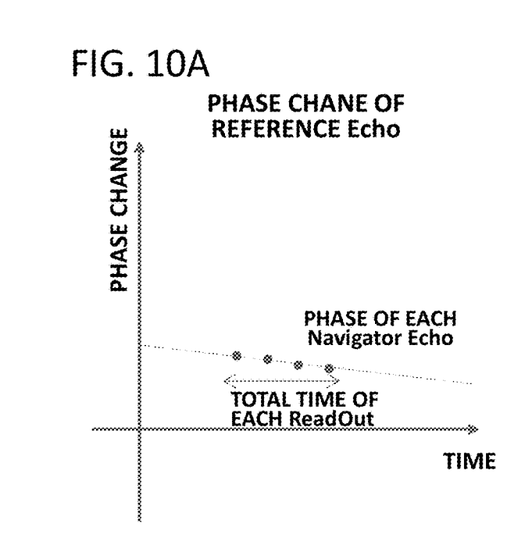
FIGS. 10A and 10B respectively illustrate the phase change of the reference navigator echo and the phase change of the target navigator echo.
Figure 10B:
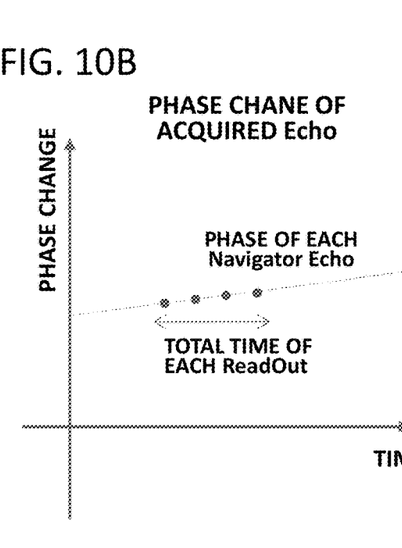
Figure 10C:
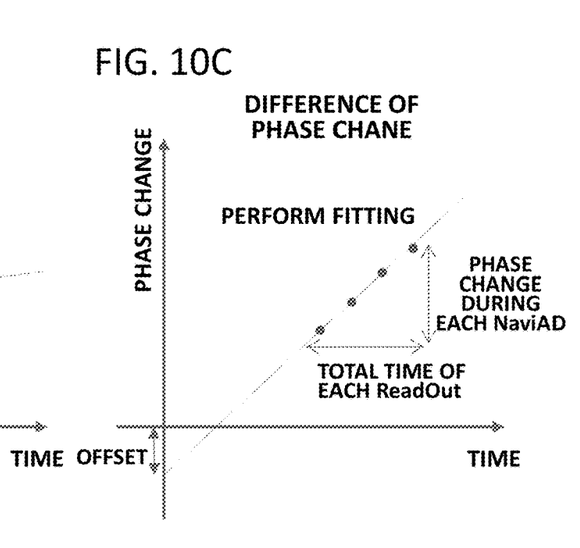

FIGS. 10A to 10C shows the state of the fitting of the phase difference. FIGS. 10A and 10B illustrate the phase change of the reference navigator echo and the phase change of the target navigator echo, respectively, and FIG. 10C illustrates the phase change of the difference therebetween. As shown in FIG. 10C, the offset has occurred in the phase in this example, and the straight line after the fitting has an intercept (d of Equation 1) corresponding to the offset. Since the phase change amount can be determined from the slope of the straight line, it is possible to calculate an accurate phase change amount without being affected by the offset.

Similar to Embodiment 1, the correction value is calculated based on the phase change amount thus obtained (S57), the shim current is corrected by using the correction value, and the irradiation frequency in the main imaging is corrected or the misalignment is corrected at the time of image reconstruction in the main imaging (S58). In the present embodiment, however, since the readout gradient is applied when acquiring the navigator echo, there remains information of application axis in the navigator echo. Therefore, by use of the information, conventional correction according to body motion may be performed, or it is possible to correct the static magnetic field variation in the physical axis direction obtained from the application axis of the readout gradient.

<Modification of Embodiment 2>

Figure 11:
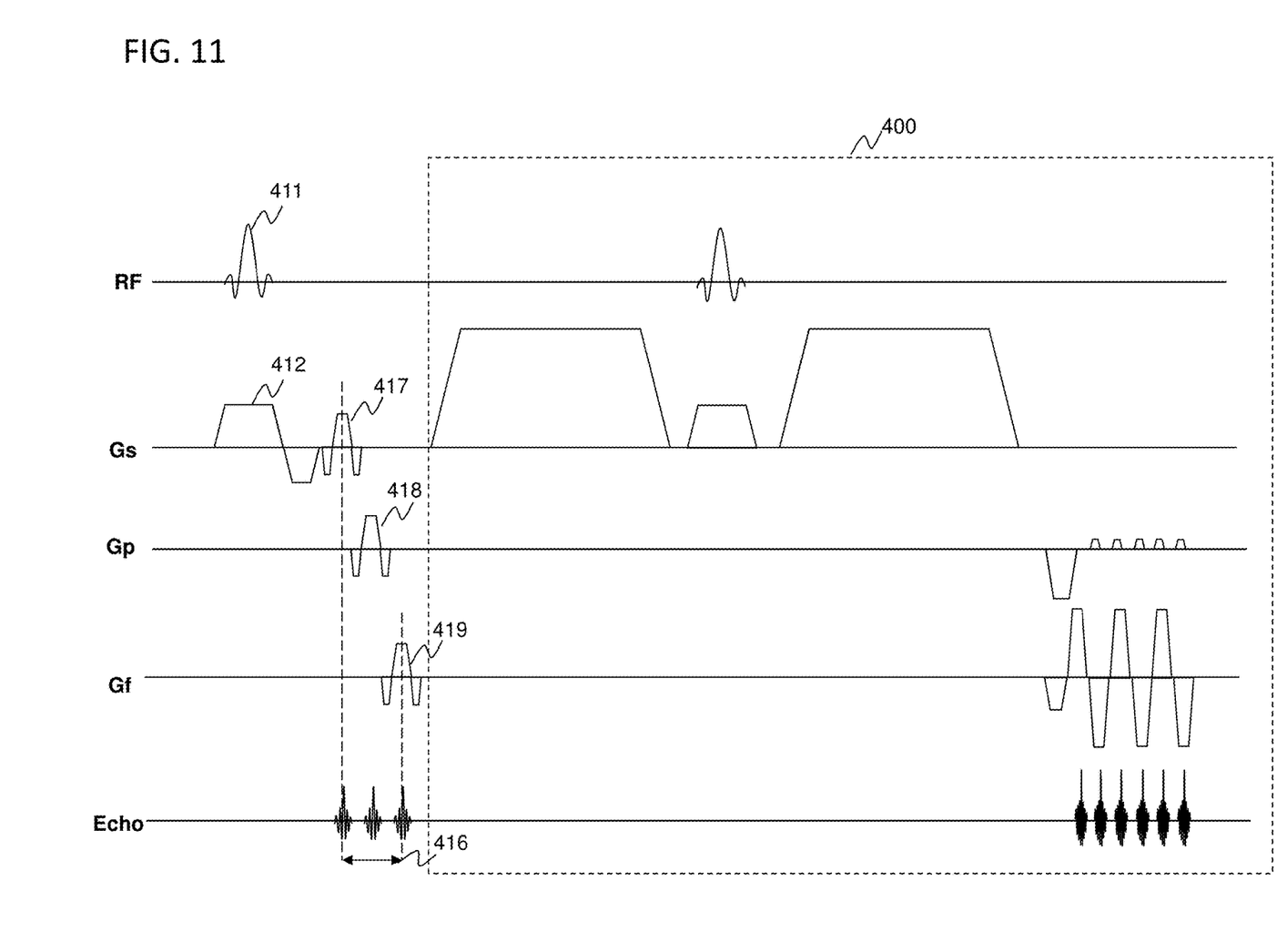
FIG. 11 illustrates an example of the pulse sequence employed in Modification of Embodiment 2.

In Embodiment 2, the readout gradient is applied to one axis, but as shown in FIG. 11, the axis to which the readout gradients 417 to 419 are applied may be differentiated to acquire the navigator echo 416. In the present modification, the phase difference is calculated as to the navigator echoes collected at the same application axis, among the reference navigator echoes and the target navigator echoes of different application axes of the readout gradients respectively, and the phase difference is subjected to fitting. Calculating the correction value by using the phase difference, and reflecting the correction value to the main imaging are the same as in Embodiment 2.

In the present embodiment, since it is possible to obtain information of each axis from the navigator echoes, conventional correction according to body motion may be performed by using the information of each axis, or the static magnetic field variation of each physical axis may be corrected.

In FIG. 11, one navigator echo is acquired for each axis, but two or more navigator echoes may be obtained, in which case, the phase difference for each application axis is calculated to obtain the correction value for each axis.

There have been described the embodiments and modifications of the measurement and processing of the navigator echo so far. Any of these embodiments and modifications may be incorporated in the apparatus in advance, or a user may select any of them or set conditions at the time of DWI imaging. In the next embodiment, there will be described an embodiment of a UI that enables user selection.

Embodiment 3

Figure 12:
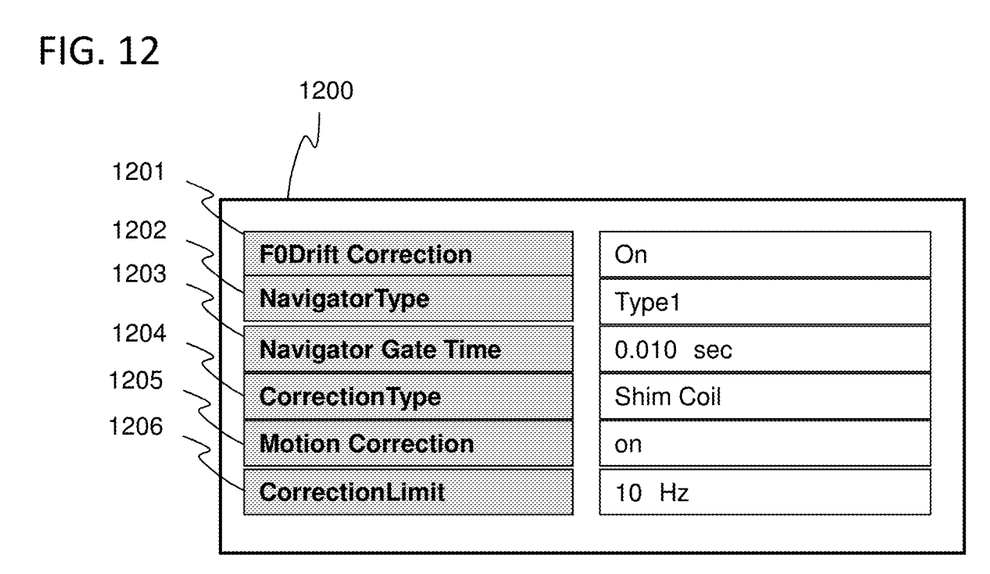
FIG. 12 illustrates an example of a UI screen of Embodiment 3.

The MRI apparatus of the present embodiment allows a user to set whether or not correction is necessary and conditions for the correction via the UI unit 30. With reference to FIG. 12, the process of the present embodiment will be described. FIG. 12 is a screen example displayed on the display device 31 of the UI unit 30.

In this screen example, the UI screen 1200 is provided with a button 1201 for selecting whether or not to perform frequency correction, a button 1202 for selecting a type of navigator echo, a box 1203 for specifying a time for acquiring a navigator echo, a button 1204 for selecting a correction method, a box 1205 for selecting whether to perform body motion correction, and a box 1206 for setting a threshold value for correction.

The selection button 1202 accepts a selection of which type of navigator echo to use, among Embodiments or Modifications as described above. According to this selection, the navigation controller 22 determines the navigation sequence to be executed prior to the main imaging sequence 400, and sets the selected navigation sequence in the measurement controller 4. The box 1203 indicates the sampling time (AD time) (414 in FIG. 4) in the case of the navigator echo not using the readout gradient (e.g., Embodiment 1). When the readout gradient is applied, this box indicates the total time for acquiring each of the navigator echoes. In addition, a pull-down menu may be provided with this box 1203 to allow setting of the application axes and the number of navigator echoes.

The button 1204 for selecting the correction method accepts a selection how the correction is performed. In other words, the button 1204 accepts a selection from the correction methods, such as performing correction by the shim coil, correction by setting a corrected frequency upon irradiation, and correction of an image after acquiring the main imaging echo. The box 1205 for the body motion correction is a UI that allows the user, when an abrupt change occurs, to select whether or not to perform body motion correction of the navigator echo, or whether to reacquire the reference navigator echo, or both. The box 1206 for setting the threshold is to set a threshold value for removing inappropriate correction value, and when the threshold value is provided, as described in Modification 2 of Embodiment 1, the correction value out of the range, determined by thus provided upper limit threshold and lower limit threshold, is not adopted as the correction value.

Thus, according to the present embodiment, the user can change correction accuracy according to conditions, and an image quality expected by the user can be obtained. FIG. 12 is only an example of the UI screen, and it is also possible to omit some of the conditions listed here or add any different condition.

What is claimed is:

1. A magnetic resonance imaging apparatus comprising,
an imaging unit having a static magnetic field generator configured to generate a static magnetic field in a space where a subject is placed, a transmitter configured to apply an RF magnetic field to the subject, and a receiver configured to receive a nuclear magnetic resonance signal generated by nuclear magnetic resonance from the subject,
an operation unit configured to perform an operation including image reconstruction by using the nuclear magnetic resonance signal,
a navigation controller configured to control the imaging unit to generate a navigator echo and collect navigation data during a predetermined measurement time, prior to collection of nuclear magnetic resonance signals for reconstructing an image of the subject, and
a navigation analyzer configured to analyze phase change of the navigator echo during the measurement time to calculate a correction value for correcting misalignment due to the phase change, wherein
the navigation analyzer calculates a phase change amount relative to a reference, based on a difference between the phase change of the navigator echo at each time of the measurement time, and the phase change of the navigator echo serving as the reference at each time of the measurement time, so as to calculate the correction value.

2. The magnetic resonance imaging apparatus according to claim 1, wherein,
the navigation analyzer further comprises a fitting unit configured to perform fitting of the phase change or of the difference between the phase changes, so as to calculate the phase change amount from a phase change difference obtained by fitting.

3. The magnetic resonance imaging apparatus according to claim 1, wherein
the navigation controller collects the navigator echo, without using frequency encoding.

4. The magnetic resonance imaging apparatus according to claim 1, wherein
the navigation controller uses the frequency encoding to collect two or more navigator echoes within the predetermined measurement time.

5. The magnetic resonance imaging apparatus according to claim 4, wherein,
the navigation controller uses the frequency encoding in three axial directions to collect the navigator echoes respectively in the three axial directions within the predetermined measurement time.

6. The magnetic resonance imaging apparatus according to claim 1, wherein,
the imaging unit repeatedly executes the collection of the nuclear magnetic resonance signals for the image reconstruction at every repetition time, and
the navigation controller performs generation and collection of the navigator echoes at every repetition time.

7. The magnetic resonance imaging apparatus according to claim 6, wherein,
the navigation controller performs the generation and collection of the navigator echoes serving as the reference more than once, and the navigation analyzer calculates the correction value by using the phase change of one navigator echo serving as the reference, and the phase change of the navigator echo collected until the collection of the next navigator echo serving as the reference.

8. The magnetic resonance imaging apparatus according to claim 7, wherein,
the navigation analyzer determines whether or not the correction value falls into a predetermined range of threshold, and uses a value within the range of threshold as the correction value.

9. The magnetic resonance imaging apparatus according to claim 1, wherein,
the transmitter, with use of the correction value calculated by the navigation analyzer, corrects a frequency of RF magnetic field applied after the collection of the navigator echo used for calculating the correction value.

10. The magnetic resonance imaging apparatus according to claim 1, wherein,
the static magnetic field generator corrects the static magnetic field by using the correction value calculated by the navigation analyzer to.

11. The magnetic resonance imaging apparatus according to claim 1, wherein,
the operation unit corrects misalignment of the image reconstructed from the nuclear magnetic resonance signals by using the correction value calculated by the navigation analyzer.

12. The magnetic resonance imaging apparatus according to claim 1, wherein,
the collection of the nuclear magnetic resonance signals for the image reconstruction, performed by the imaging unit, is diffusion weighted imaging including application of MPG pulses.

13. The magnetic resonance imaging apparatus according to claim 1, further comprising,
a UI unit configured to accept user designation, regarding generation and collection of the navigator echo.

14. The magnetic resonance imaging apparatus according to claim 13, wherein,
the UI unit accepts user selection for selecting a type of navigator echo.

15. The magnetic resonance imaging apparatus according to claim 13, wherein,
the UI unit accepts the user selection regarding a correction method.

* * * * *